United States Patent

Miura et al.

[11] Patent Number: 6,031,252
[45] Date of Patent: *Feb. 29, 2000

[54] EPITAXIAL WAFER AND METHOD OF PREPARING THE SAME

[75] Inventors: Yoshiki Miura; Mitsuru Shimazu; Kensaku Motoki; Takuji Okahisa; Masato Matsushima, all of Hyogo; Hisashi Seki; Akinori Koukitu, both of Tokyo, all of Japan

[73] Assignee: Sumitomo Electric Industries, Ltd., Osaka, Japan

[ * ] Notice: This patent is subject to a terminal disclaimer.

[21] Appl. No.: 08/705,330

[22] Filed: Aug. 29, 1996

[30] Foreign Application Priority Data

Sep. 8, 1995 [JP] Japan .................................. 7-257070

[51] Int. Cl.$^7$ .................................................. H01L 33/00
[52] U.S. Cl. .............................. 257/96; 257/94; 257/190; 257/201; 427/108; 427/110; 427/123; 438/47; 438/479; 438/483; 438/488
[58] Field of Search ...................... 438/604, 605, 438/606, 47, 474, 483, 488; 458/483, 488, 502; 257/94, 96, 190, 201; 427/108, 110, 123

[56] References Cited

U.S. PATENT DOCUMENTS

| | | | |
|---|---|---|---|
| 3,675,619 | 7/1972 | Burd | 118/719 |
| 3,933,538 | 1/1976 | Akai et al. | 117/57 |
| 4,833,103 | 5/1989 | Agostinelli et al. | 438/479 |
| 5,665,986 | 9/1997 | Miura et al. | 257/96 |

FOREIGN PATENT DOCUMENTS 4-297023  10/1992  Japan .

OTHER PUBLICATIONS

"Comparison of Hydride Vapor Phase Epitaxy of GaN Layers on Cubic GaN/(100) GaAs and Hexagonal GaN/(111) GaAs Substrates"; Japan Journal of Applied Phys.; vol. 33 (1994) pp. 6448–6453; Part I, No. 12A, Dec. 1994. (Tsuchiya et al.).

"Study on Mechanism of Cubic Structural Transformation Heteroepitaxy of Nitride Compound Semiconductors"; Japan, Dept. of Applied Physics, Faculty of Engineering; University of Tokyo; vol. 21, No. 5, 1994 (supplem., pp. S409 to S414) (Onabe).

*Primary Examiner*—Charles Bowers
*Assistant Examiner*—Reneé R. Berry
*Attorney, Agent, or Firm*—W. F. Fasse; W. G. Fasse

[57] ABSTRACT

An epitaxial wafer enabling epitaxial growth at a high temperature includes a compound semiconductor substrate containing As or P, and a covering layer including GaN; or InN; or AlN; or a nitride mixed-crystalline material containing Al, Ga, In and N. The covering layer covers at least a front surface and a back surface of the substrate. A method of preparing such an epitaxial wafer including steps of growing the covering layer at a growth temperature of at least 300° C. and less than 800° C. so as to cover at least the front and back surfaces of the substrate, and then annealing the substrate having the covering thereon layer at a temperature of at least 700° C. and less than 1200° C.

20 Claims, 9 Drawing Sheets

EPITAXIAL WAFER AND METHOD OF PREPARING THE SAME

BACKGROUND OF THE INVENTION

1. Field of the Invention

The present invention relates to an epitaxial wafer and a method of preparing the same, and more particularly, it relates to an epitaxial wafer for growing a GaN thin film thereon to be applied to a blue light emitting device or various devices for the ultraviolet region, and a method of preparing the same.

2. Description of the Background Art

FIG. 13 is a sectional view showing the structure of an epitaxial wafer employing a sapphire substrate to be applied to a GaN blue light emitting device (LED), which is now on the market.

Referring to FIG. 13, this epitaxial wafer comprises a sapphire substrate 11, a gallium nitride (GaN) buffer layer 12 which is formed on the substrate 11, and a hexagonal GaN epitaxial layer 13 which is formed on the GaN buffer layer 12. In this epitaxial wafer, the GaN buffer layer 12 is adapted to relax distortion resulting from the difference between the lattice constants of the sapphire substrate 11 and the GaN epitaxial layer 13.

FIG. 14 is a sectional view showing the structure of a GaN blue light emitting device employing the epitaxial wafer shown in FIG. 13.

Referring to FIG. 14, a cladding layer 14, a active layer 15, another cladding layer 16 and a GaN epitaxial layer 17 are successively formed on the epitaxial wafer shown in FIG. 13 in this blue light emitting device, while ohmic electrodes 18 and 19 are formed on the GaN epitaxial layers 13 and 17 respectively.

Referring to FIGS. 13 and 14, the substrate 11 of this epitaxial wafer is prepared from insulating sapphire. In order to prepare the device by forming the electrodes, therefore, photolithographic patterning must be performed at least twice while the nitride layers must be etched by reactive ion etching, which complicated process steps. Further, sapphire is hard to treat due to its hardness. In addition, sapphire is uncleavable and thus has such a problem in application to a light emitting device that it cannot be applied to a laser diode utilizing a cleavage plane as an optical resonator.

To this end, an attempt has been made for employing a conductive volatile material such as GaAs for the substrate in place of sapphire having the aforementioned disadvantages.

When the volatile material such as GaAs is employed as the substrate, however, volatile arsenic (As) is lost from the back surface of the substrate in epitaxial growth, to disadvantageously damage the substrate.

Consequently, the treatment temperature cannot be much increased in growth of a GaN epitaxial layer. Thus, the obtained GaN epitaxial layer is limited in improvement of characteristics.

SUMMARY OF THE INVENTION

An object of the present invention is to provide an epitaxial wafer which enables epitaxial growth at a high temperature and a method of preparing the same by solving the aforementioned problems.

The epitaxial wafer according to the present invention comprises a compound semiconductor substrate containing a volatile component such as arsenic (As) or phosphorus (P), and a covering layer which is formed to cover at least the front and back surfaces of the substrate. The covering layer includes GaN; or InN; or AlN; or a nitride mixed-crystalline material containing Al, Ga, In and N. Nitride mixed-crystalline materials containing Al, Ga, In and N include ternary mixed-crystalline materials of AlGaN, InGaN and AlInN, and a quaternary mixed-crystalline material of AlInGaN.

According to the present invention, the front and back surfaces of the volatile substrate are covered with the covering layer consisting of a thin film of GaN or the like, whereby no volatile component such as As or P is lost from the back surface of the substrate. Therefore, a thin film of GaN or the like, which must be epitaxially grown at an extremely high temperature of 800 to 1200° C. in general, can be readily grown while growth of an epitaxial layer having excellent characteristics is enabled.

The covering layer may cover not only the front and back surfaces but the end surfaces of the substrate, thereby covering the overall surfaces of the substrate.

The thickness of the covering layer is preferably at least 5 nm and less than 5 $\mu$m, and more preferably, at least 10 nm and less than 1 $\mu$m. If the thickness of the covering layer is smaller than 5 nm, pinholes are partially caused due to annealing after growth. If the thickness of the covering layer exceeds 5 $\mu$m, on the other hand, the surfaces are extremely irregularized and the cost is increased to result in an economic disadvantage in industrial production.

The volatile substrate employed in the present invention may be prepared from a binary system crystal substrate of GaAs, InP, GaP or InAs, or a ternary mixed-crystalline substrate of AlGaAs or GaAsP, for example.

The method of preparing an epitaxial wafer according to the present invention comprises the steps of growing a covering layer including GaN; or InN; or AlN; or a nitride mixed-crystalline material containing Al, Ga, In and N at a growth temperature of at least 300° C. and less than 800° C. for covering at least the front and back surfaces of a substrate containing arsenic (As) or phosphorus (P), and annealing the substrate provided with the grown covering layer at a temperature of at least 700° C. and less than 1200° C.

The growth temperature is set in the range of at least 300° C. and less than 800° C., since no thin film of GaN or the like is grown if the temperature is less than 300° C. If the growth temperature exceeds 800° C., on the other hand, the thin film of GaN or the like is pyramidally grown and a practical covering layer having excellent flatness cannot be formed.

The growth temperature is preferably at least 400° C. and less than 600° C. According to the present invention, the substrate is annealed after growth of the covering layer, in order to single-crystallize the thin film of GaN or the like grown as the covering layer. The annealing must be performed for a long time if the temperature is at a low level, while the annealing time may be short if the temperature is at a high level. In more specific terms, the annealing is preferably performed for about 10 minutes at a temperature of 850° C., or for about 5 minutes at a temperature of 1100° C., for example. While the method of growing the covering layer is not particularly restricted, OMVPE (organometallic vapor phase epitaxy), GS-IBE (gas source molecular beam epitaxy), hydride VPE (vapor phase epitaxy) or MOCVPE (metal-organic chloride vapor phase epitaxy) is employed.

The OMVPE is adapted to introduce a first gas containing trimethyl gallium (TMGa) or the like and a second gas containing ammonia (NH$_3$) into a reaction chamber while heating only a substrate provided in the reaction chamber by RF (radio frequency) induction heating, for vapor-phase growing an epitaxial layer of GaN or the like on the substrate.

The hydride VPE process is adapted to set a substrate and a source boat containing a metal such as Ga in a reaction chamber and introduce a first gas containing hydrogen chloride (HCl) and a second gas containing ammonia ($NH_3$) into the reaction chamber while heating the overall reaction chamber with a resistance heater from the exterior, thereby vapor-phase growing an epitaxial layer of GaN or the like on the substrate.

The MOCVPE process is adapted to introduce a first gas containing an organometallic raw material including gallium or the like and hydrogen chloride, and a second gas containing ammonia into a reaction chamber while heating the overall reaction chamber from the exterior, thereby vapor-phase growing an epitaxial layer on a substrate which is set in the reaction chamber.

In the present invention, the substrate is preferably mirror-finished not only on the front surface but also on the back surface, in order to form the covering layer on the front and back surfaces of the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Example 1)

Figure 1:
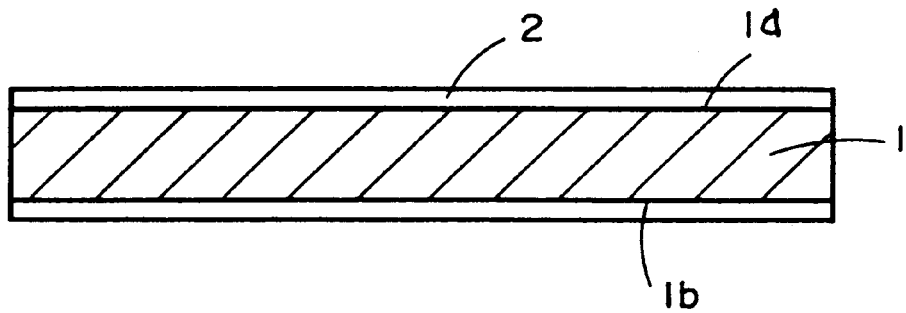
FIG. 1 is a sectional view showing the structure of an exemplary epitaxial wafer according to the present invention.

FIG. 1 is a sectional view showing the structure of an exemplary epitaxial wafer according to the present invention. Referring to FIG. 1, a covering layer 2 consisting of GaN is formed on a front surface 1a and a back surface 1b of a GaAs substrate 1 in this epitaxial wafer.

Figure 2:
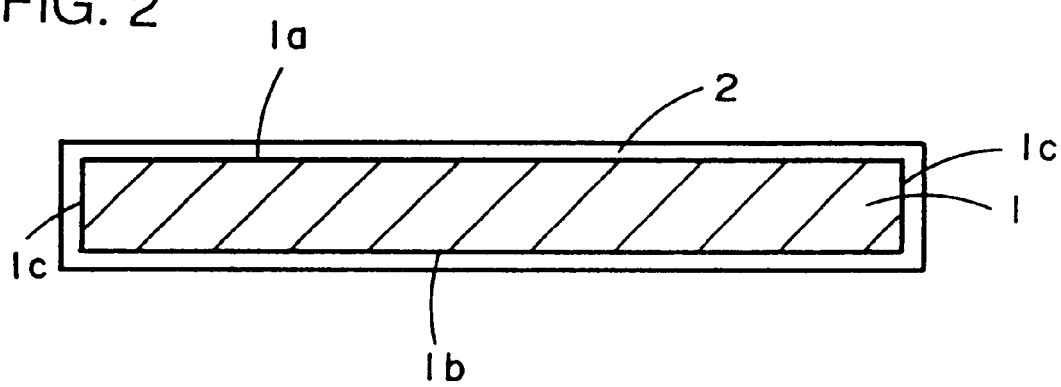
FIG. 2 is a sectional view showing the structure of another exemplary epitaxial wafer according to the present invention.

FIG. 2 is a sectional view showing the structure of another exemplary epitaxial wafer according to the present invention. Referring to FIG. 2, a covering layer 2 consisting of GaN is formed on a front surface 1a, a back surface 1b and end surfaces 1c of a GaAs substrate 1 in this epitaxial wafer.

A method of preparing an epitaxial wafer having the aforementioned structure is now described.

While the following description is with reference to MOCVPE, the method of growing the covering layer is not restricted to this.

Figure 3:
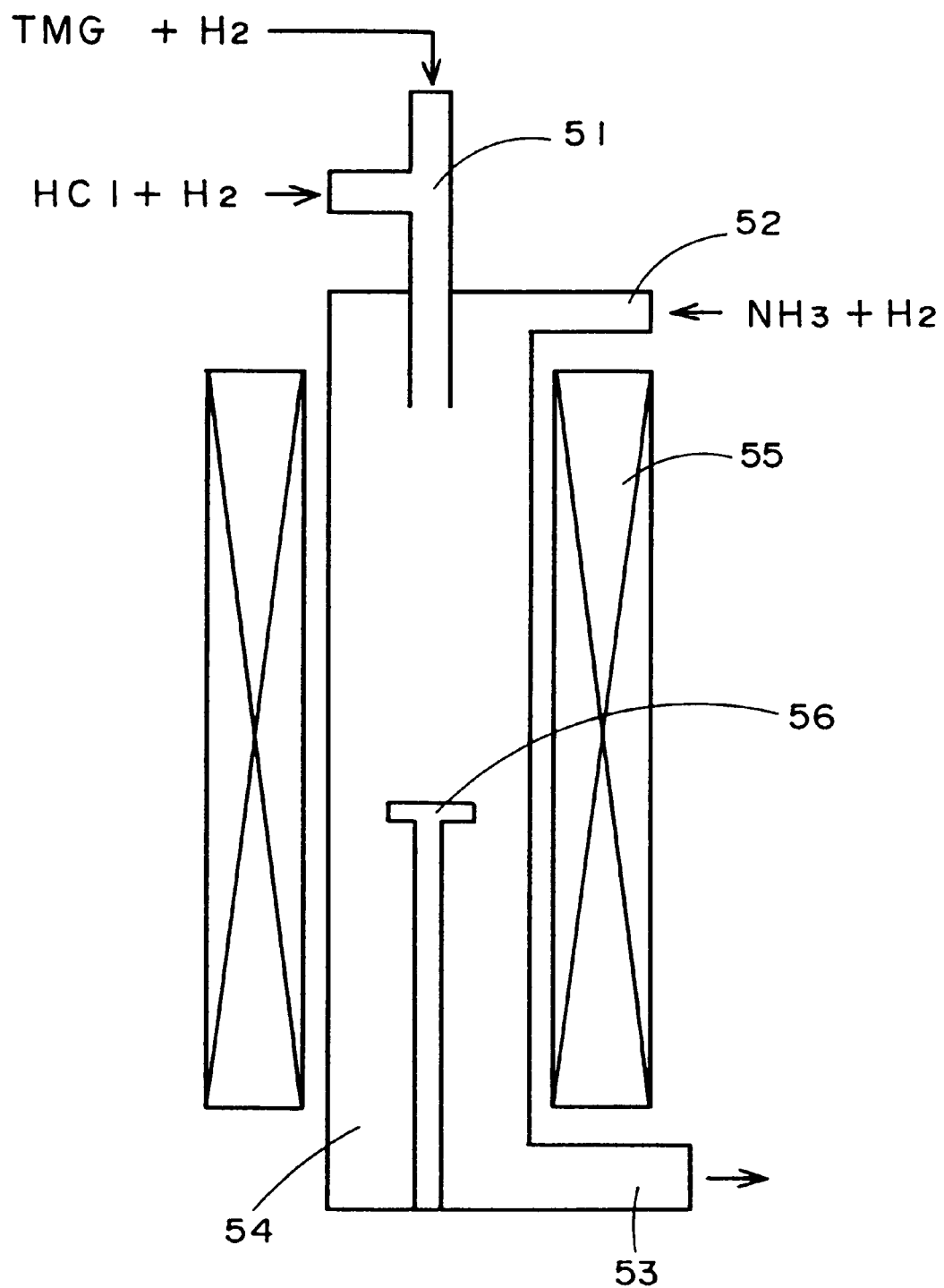
FIG. 3 schematically illustrates the structure of a vapor phase epitaxy apparatus employed in MOCVPE.

FIG. 3 schematically illustrates the structure of a vapor phase epitaxy apparatus employed for MOCVPE. Referring to FIG. 3, this apparatus is formed by a reaction chamber 54 having a first gas inlet 51, a second gas inlet 52 and an outlet 53, and a resistance heater 55 for heating the overall interior of the chamber 54 from the exterior.

With the apparatus having the aforementioned structure, an epitaxial wafer was prepared as follows:

Referring to FIG. 3, a gallium arsenide (GaAs) (100) plane substrate 1 having mirror-finished surfaces pretreated with a general etching solution of $H_2SO_4$ was set on a holder 56 consisting of quality provided in the reaction chamber 54.

Figure 4:
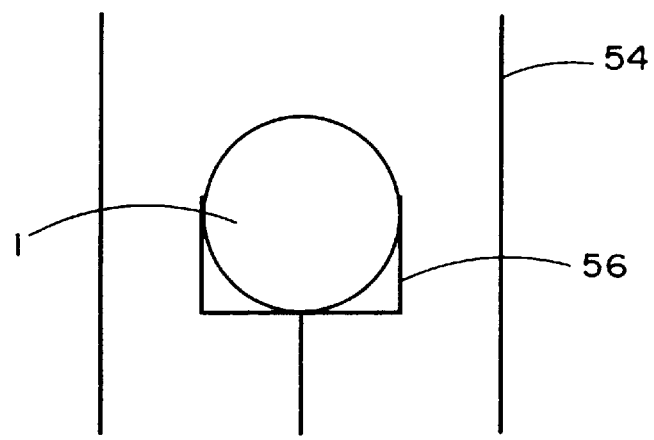
FIG. 4 is adapted to illustrate an exemplary method of holding a substrate during growth of a covering layer in a method of preparing an epitaxial wafer according to the present invention.
Figure 5:
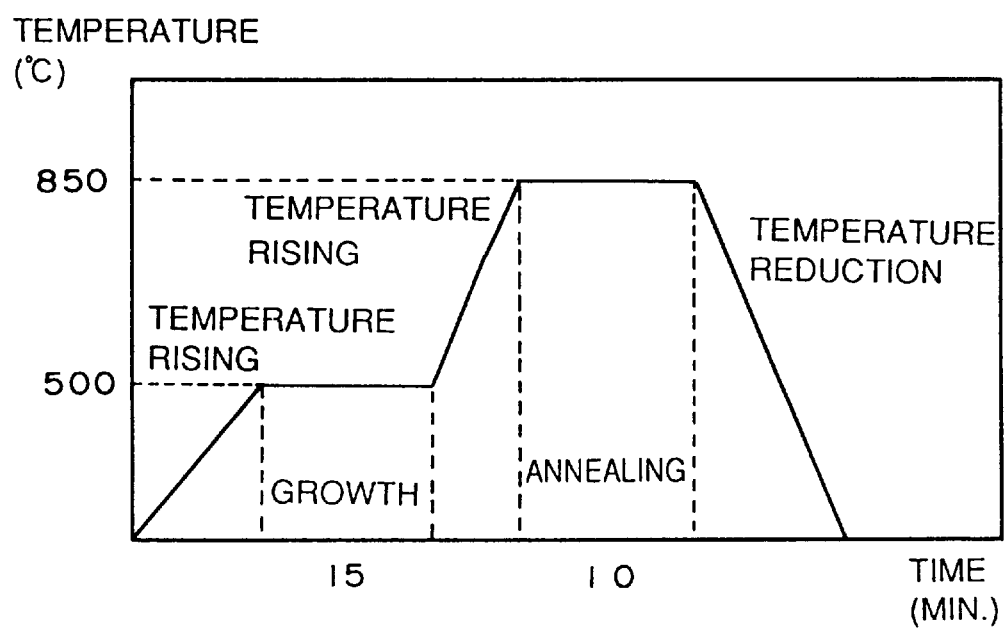
FIG. 5 illustrates an exemplary growth sequence during growth of the covering layer in the method of preparing an epitaxial wafer according to the present invention.

At this time, the substrate 1 was perpendicularly held by the holder 56 as shown in FIG. 4, for enabling growth of a covering layer on the front and back surfaces of the substrate 1. Then, a covering layer consisting of GaN was grown on the front and back surfaces of the substrate 1 by carrying out along a growth sequence shown in FIG. 5.

First, the overall interior of the reaction chamber 54 was heated with the resistance heater 55 from the exterior for increasing the temperature of the substrate 1 up to 500° C. in hydrogen, and trimethyl gallium (TMGa) and hydrogen chloride (HCl) were introduced as group III raw materials from the first gas inlet 51 at partial pressures of $8 \times 10^{-4}$ atm. and $8 \times 10^{-4}$ atm. respectively, while ammonia gas ($NH_3$) was introduced as a group V raw material from the second gas inlet 52 at a partial pressure of $1.6 \times 10^{-1}$ atm. Epitaxial growth was carried out under such conditions for 15 minutes, thereby forming a covering layer 2 of 30 nm in thickness consisting of GaN.

Thereafter the temperature of the substrate 1 was increased up to 850° C., and annealed for about 10 minutes. The atmosphere gas for annealing the substrate 1 may be an inert gas such as argon, in place of hydrogen gas or nitrogen gas. The treatment temperature for the annealing is preferably at least 700° C. and less than 1200° C. This annealing has a remarkable effect on single-crystallization of the grown GaN thin film.

For the purpose of confirmation, a wafer sample was investigated with a transmission electron microscope (TEM) and through electron beam diffraction before and after annealing, to observe that the GaN thin film which was polycrystalline in the unannealed state was converted to a single-crystalline film after the annealing.

Figure 6:
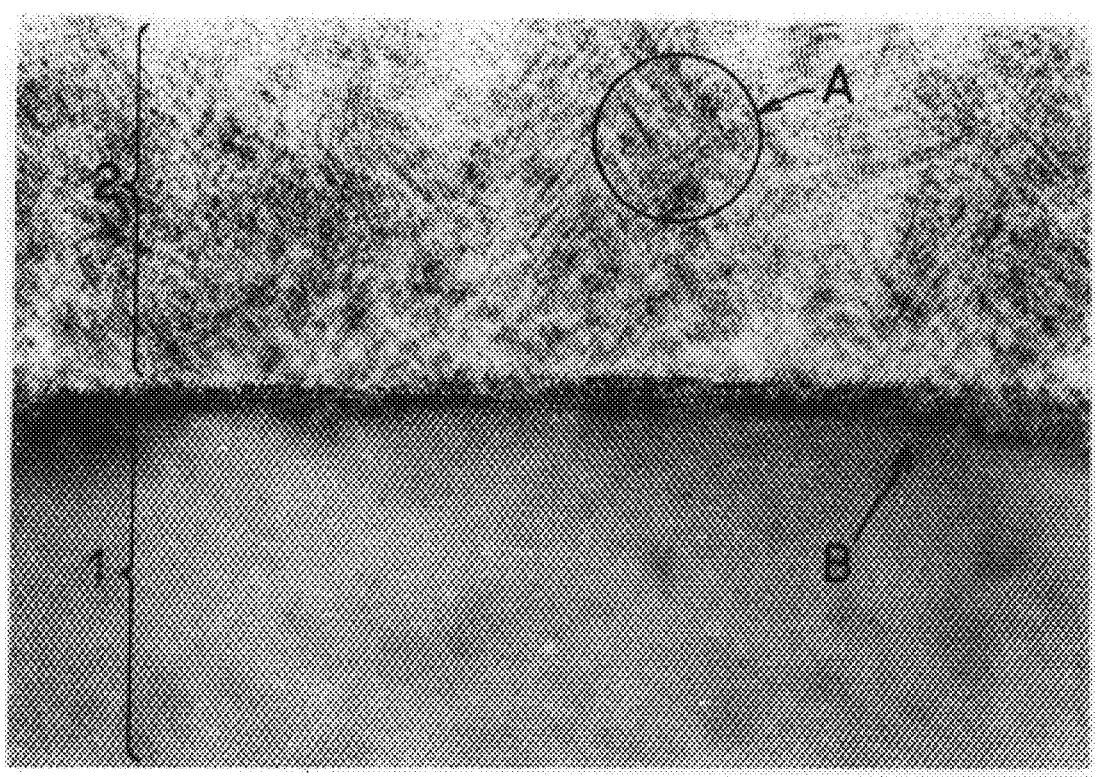
FIG. 6 is a photograph showing a TEM image of the crystal structure of an unannealed sample.

FIG. 6 is a photograph showing a high resolution TEM image of the crystal structure of the unannealed sample as viewed from the (110) direction. Referring to FIG. 6, it is understood that the GaN thin film 2 formed on the substrate 1 consists of a number of polycrystals having various orientations, as shown by arrow A. While the interface between the GaAs substrate 1 and the GaN thin film 2 is extremely flat, a dark part shown by arrow B, which may have conceivably been caused due to the lattice constant difference, was observed in a portion of the GaAs substrate 1 close to the GaN thin film 2.

Figure 7:
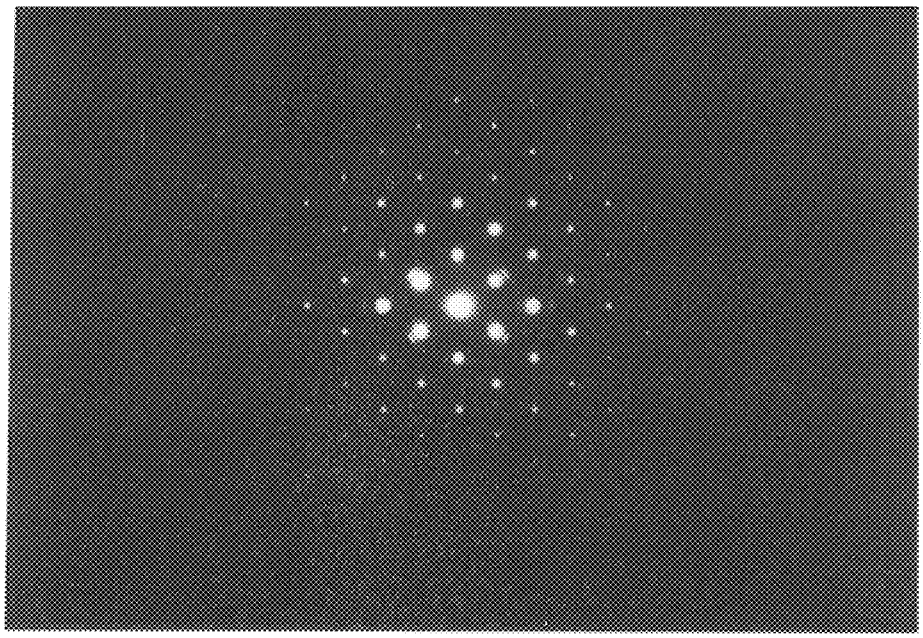
FIG. 7 is a photograph showing an electron beam diffraction pattern of the crystal structure of the annealed sample.

FIG. 7 is a photograph showing an electron beam diffraction pattern of the crystal structure of the unannealed sample shown in FIG. 6 as viewed from the (110) direction, similarly to the above.

Figure 8:
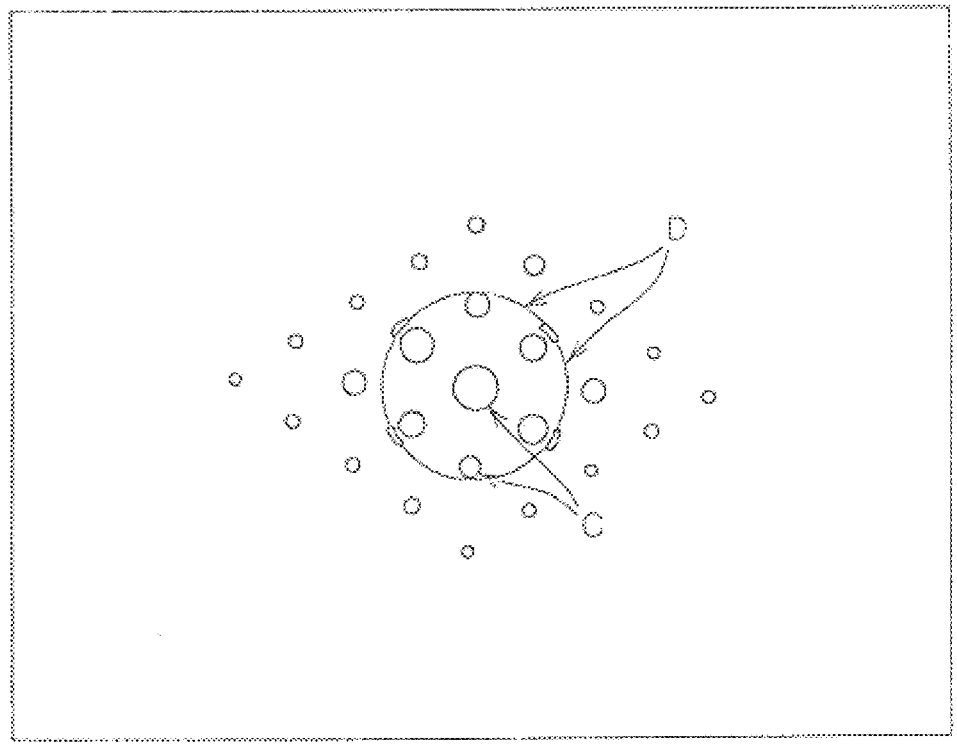
FIG. 8 is a model diagram showing the central portion of FIG. 7 in an enlarged manner.

FIG. 8 is a model diagram showing the central portion of FIG. 7 in an enlarged manner.

Referring to FIGS. 7 and 8, the electron beam diffraction pattern consists of strong diffraction spots from the GaAs substrate 1 shown by arrows C, and ring patterns from the GaN thin film 2 shown by arrows D. Thus, it is understood that the GaN thin film 2 was mainly formed by polycrystals in the unannealed sample.

Figure 9:
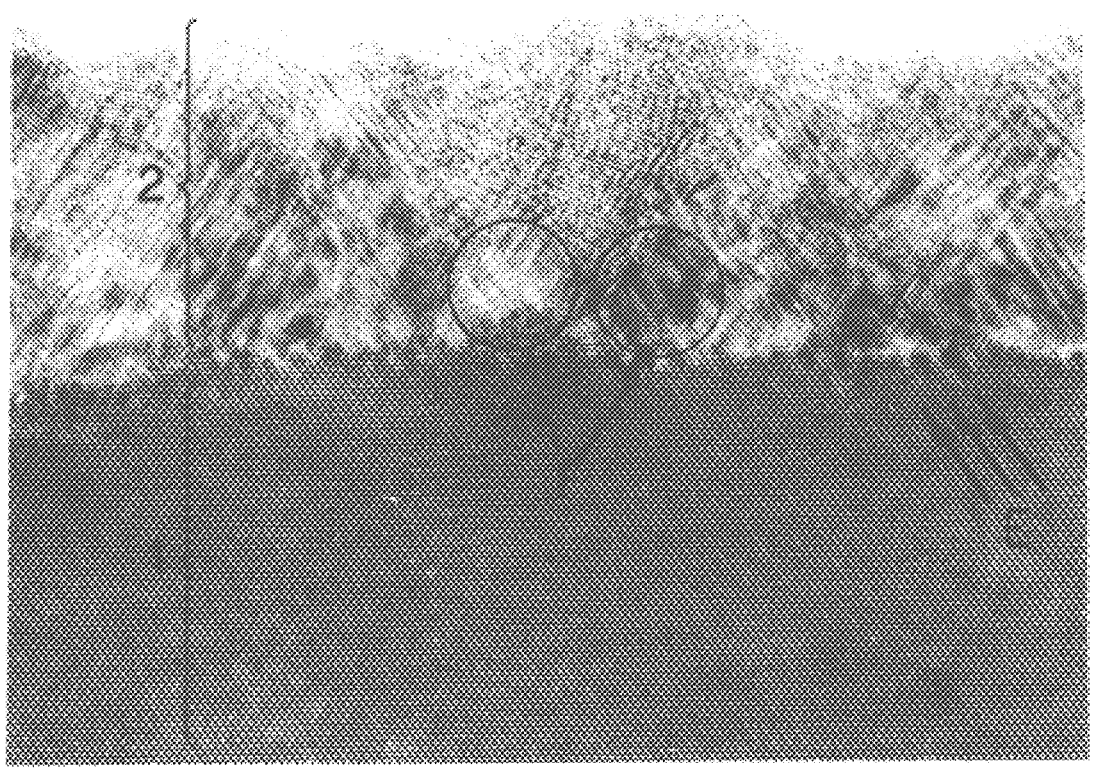
FIG. 9 is a photograph showing a TEM image of the crystal structure of an annealed sample.

On the other hand, FIG. 9 is a photograph showing a high resolution TEM image of the crystal structure of the sample annealed at 850° C. for 10 minutes, as viewed from the (110) direction.

Referring that had been to FIG. 9, it is understood that the dark part observed in the interface between the substrate 1 and the GaN thin film 2 in the unannealed sample shown in FIG. 6 disappeared by stress relaxation by the thermal annealing. Further, facet growth of (111) crystal planes observed in the vicinity of the surface of the GaAs substrate 1. the spaces between dark lines shown by arrows E indicate that five GaN lattices are linked to four GaAs lattices periodically with misfit dislocations, and this agrees with the difference between the lattice constants of GaN and GaAs. Thus, it is understood that the GaN thin film 2 consists of single-crystalline cubic GaN, although some defects extending in the (111) direction are present in a stress-relaxed state. While bright/dark parts are observed in a portion of the GaN thin film 2 close to the GaAs substrate 1 as shown by arrows F, this means that crystals having slightly different crystal orientations are mixed with each other in the portion of the GaN thin film 2 close to the GaAs substrate 1.

Figure 10:
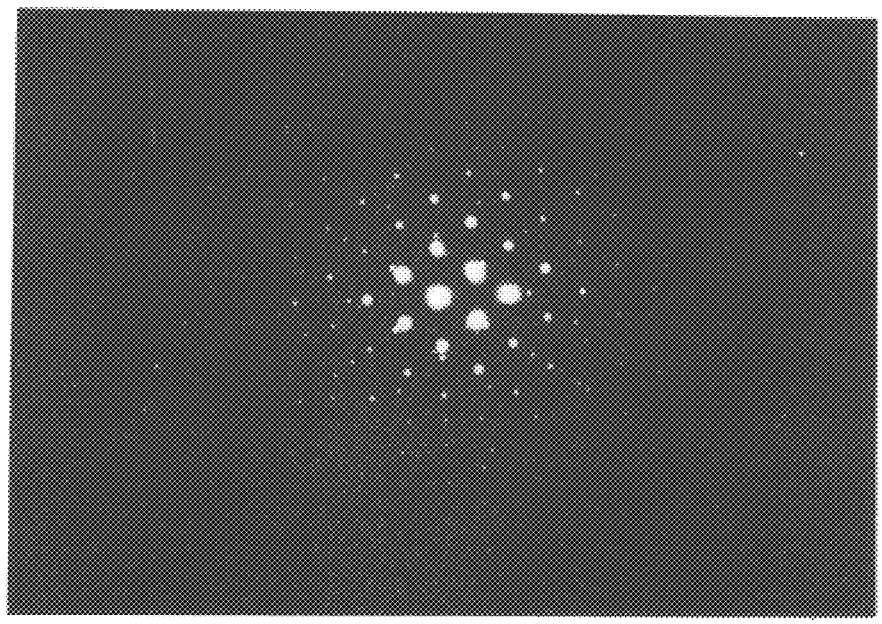
FIG. 10 is a photograph showing an electron beam diffraction pattern of the crystal structure of the annealed sample.

FIG. 10 is a photograph showing an electron beam diffraction pattern of the crystal structure of the annealed sample shown in FIG. 9 as viewed from the (110) direction, similarly to the above.

Figure 11:
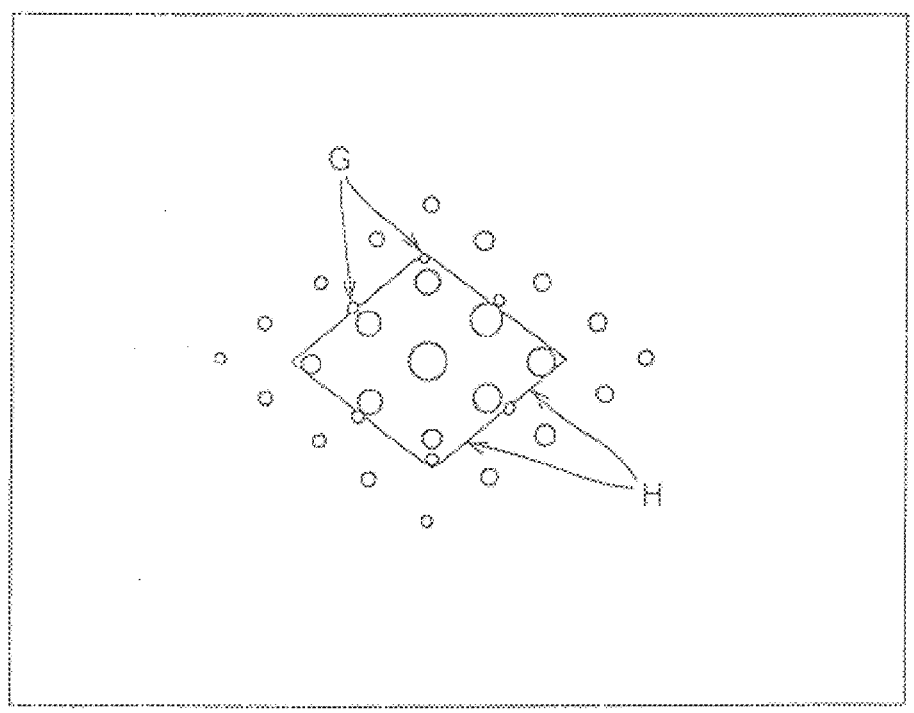
FIG. 11 is a model diagram showing the central portion of FIG. 10 in an enlarged manner.

FIG. 11 is a model diagram showing the central portion of FIG. 10 in an enlarged manner.

Referring to FIGS. 10 and 11, it is understood that the ring patterns observed in the unannealed sample shown in FIGS. 7 and 8 changed to spot patterns as shown by arrows G. This means that the GaN thin film 2 was single-crystallized by the thermal annealing. Further, line patterns in the (1111) direction were also observed as shown by arrows H. From these results, it is understood that the annealing step after growth of the GaN thin film is important for single-crystallizing the polycrystalline film.

Then, the substrate 1 provided with the covering layer 2 consisting of GaN was taken out from a growth furnace once, and set in the epitaxy apparatus again as a substrate, for carring out GaN epitaxial growth. The growth temperature was increased up to 850° C. by the resistance heater 55, and thereafter epitaxial growth was carring out with TMGa, HCl and NH$_3$ at partial pressures of $8 \times 10^{-4}$ atm., $8 \times 10^{-4}$ atm. and $1.6 \times 10^{-1}$ atm. respectively for 60 minutes.

Consequently, a mirror-faced GaN epitaxial layer of 3 μm in thickness was formed on the substrate 1 which was covered with the covering layer 2. In a photoluminescence (PL) spectrum of this GaN epitaxial layer, strong luminescence having a peak wavelength of 360 nm was observed. As a result of X-ray diffraction, it was confirmed that a cubic GaN epitaxial layer including no hexagonal system was grown.

For the purpose of comparison, a substrate which was not annealed after growth of a GaN thin film serving as a covering layer was employed for growing a GaN epitaxial layer thereon under conditions similar to the above. In case of employing the unannealed substrate, the covering layer was separated after growth of the epitaxial layer. This is conceivably because the GaN thin film serving as a covering layer remained in a polycrystalline state and was hence separated during in the epitaxial growth at a high temperature.

Figure 12:
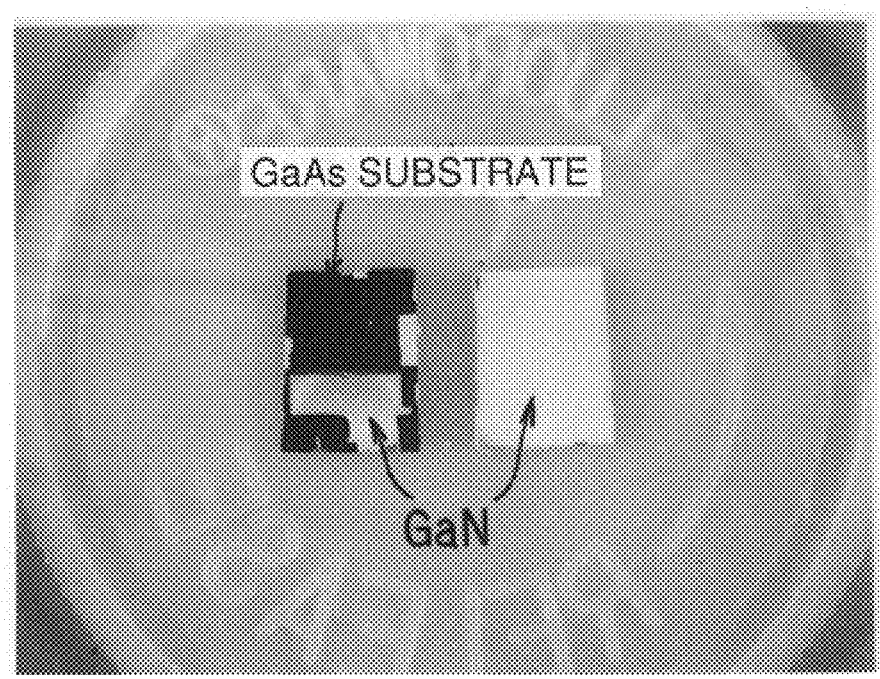
FIG. 12 is a stereomicrophotograph showing surfaces of GaN epitaxial wafers.
Figure 13:
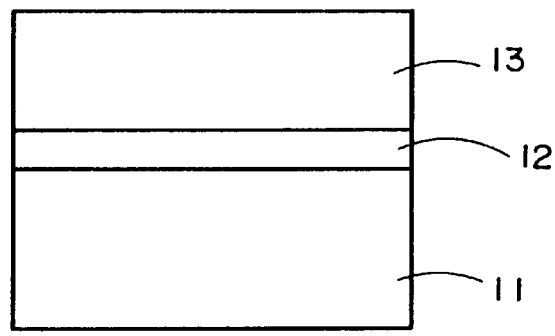
FIG. 13 is a sectional view showing the structure of an exemplary conventional epitaxial wafer.
Figure 14:
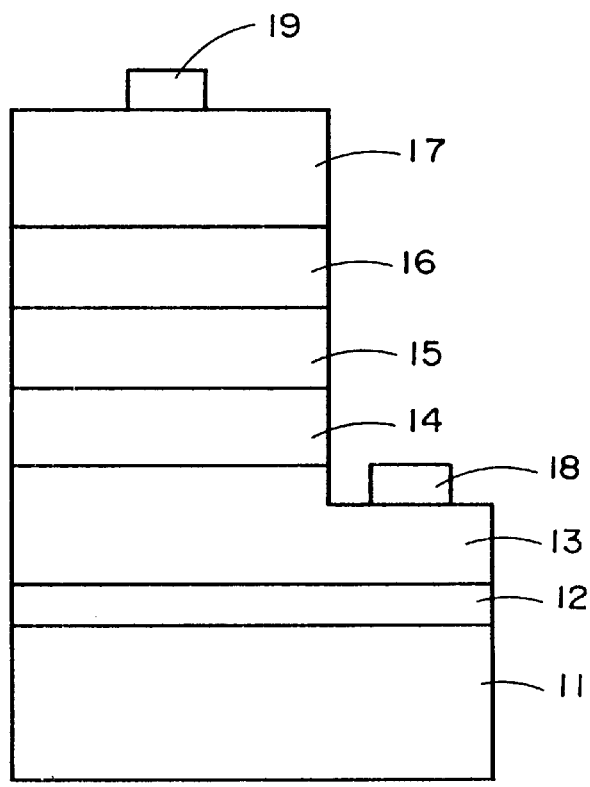
FIG. 14 is a sectional view showing the structure of a blue light emitting device employing the epitaxial wafer shown in FIG. 13.

FIG. 12 is a stereomicrophotograph showing surfaces of GaN epitaxial wafers. Samples employing unannealed and annealed substrates are shown on the left and right sides respectively.

It is clearly understood from FIG. 12 that a covering layer is separated from an unannealed substrate.

(Example 2)

Growth conditions for a GaN covering layer and a GaN epitaxial layer were changed as follows, for preparing an epitaxial wafer having the structure shown in FIG. 1 under conditions similar to those of Example 1.

Growth Conditions for GaN Covering Layer substrate temperature: 400° C.

TMGa partial pressure: $1 \times 10^{-4}$ atm.

HCl partial pressure: $1 \times 10^{-4}$ atm.

NH$_3$ partial pressure: $5 \times 10^{-3}$ atm.

growth time: 80 minutes

Growth Conditions for GaN Epitaxial Layer substrate temperature: 900° C.

TMGa partial pressure: $3 \times 10^{-4}$ atm.

HCl partial pressure: $3 \times 10^{-4}$ atm.

NH$_3$ partial pressure: $8 \times 10^{-2}$ atm. growth time: 60 minutes

Thus, a mirror-faced GaN epitaxial layer of 8 μm in thickness was formed on a substrate which was covered with a GaN covering layer of 40 nm in thickness.

In a PL spectrum of the GaN epitaxial layer, strong luminescence having a peak wavelength of 360 nm was observed. As a result of X-ray diffraction, it was confirmed that a cubic GaN epitaxial layer containing no hexagonal system was grown.

(Comparative Example 1)

In order to investigate the difference between characteristics of GaN epitaxial layers resulting from presence or absence of the GaN covering layer, a GaN epitaxial layer was directly grown on a GaAs substrate. This GaN epitaxial layer was grown under conditions similar to those in Example 1.

Consequently, arsenic was lost from the GaAs substrate during epitaxial growth at a high temperature in case of providing no GaN covering layer, and the substrate surface was so damaged and irregularized that the GaN epitaxial layer formed thereon was separated from the substrate.

In order to compare the difference between the characteristics resulting from presence or absence of the covering layer, results of measurement of irregularity on the GaN epitaxial layer surfaces with a surface roughness tester, X-ray diffraction and PL measurement were compared with each other as to the epitaxial layers obtained in Example 1 and Comparative Example 1.

Consequently, a remarkable difference was observed as to the irregularity on the surfaces of the GaN epitaxial layers, and it was understood that surface morphology was remarkably improved by providing the GaN covering layer. Also as to the results of the X-ray diffraction and the PL measurement, extremely sharp peaks were observed only on Example 1 provided with the GaN covering layer.

(Example 3)

In order to study the optimum thickness of the GaN covering layer, GaN covering layers of various thicknesses were formed on the front and back surfaces of GaAs substrates and then GaN epitaxial layers were grown on the substrates covered with such covering layers, for comparing the characteristics of the obtained GaN epitaxial layers with each other.

The GaN covering layers and the GaN epitaxial layers were grown under conditions similar to those in Example 1.

Consequently, it has been recognized that the crystallinity of the grown GaN epitaxial layer is reduced if the thickness of the covering layer is too large or too small. Namely, it has been understood that the thickness of the GaN covering layer is preferably at least 5 nm and less than 5 µm, and more preferably at least 10 nm and less than 1 µm.

In specific terms, it has been observed that pinholes are partially formed in the covering layer when the temperature of the substrate is increased from 500° C. to 850° C. for annealing if the thickness of the GaN covering layer is too small, for example. On the other hand, it has also been observed that nucleation takes place on the GaN covering layer such that the GaN thin film serving as the covering layer is pyramidally grown along such nuclei, if the thickness of the covering layer is too large.

(Example 4)

InP, GaP, InAs, AlGaAs and GaAsP substrates were employed in place of the GaAs substrate for forming GaN covering layers under conditions similar to those in Example 1, and GaN epitaxial layers were further formed on the substrates under conditions similar to those in Example 1.

PL measurement and X-ray diffraction measurement were carried out on the epitaxial layers obtained in the aforementioned manner. Consequently, excellent peaks were obtained similarly to Example 1.

(Example 5)

Nitride mixed-crystalline materials consisting of InN, AlN, and Al, Ga, In and N were employed in place of GaN as covering layer materials for forming covering layers on substrates under conditions similar to those in Example 1, and the substrates were annealed and then GaN epitaxial layers were grown on the substrates under conditions similar to those in Example 1.

PL measurement and X-ray diffraction measurement were carried out on the epitaxial layers obtained in the aforementioned manner. Consequently, excellent peaks were obtained similarly to Example 1.

According to the present invention, as hereinabove described, a covering layer is formed on the front and back surfaces of a volatile substrate of GaAs or the like, whereby a GaN epitaxial layer can be readily grown at a high temperature.

According to the present invention, further, a cleavable conductive substrate can be employed, whereby the substrate can be applied to a low-priced LED substrate, as well as to a laser substrate employing a cleavage plane as a resonator.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An epitaxial wafer comprising:
   a compound semiconductor substrate containing at least one volatile component selected from the group consisting of As and P; and
   a covering layer, covering at least front and back surfaces of said substrate, including a material selected from the group consisting of GaN, InN, AlN, and nitride mixed-crystalline materials containing Al, Ga, In and N.

2. The epitaxial wafer in accordance with claim 1, wherein said covering layer has a thickness of at least 5 nm and less than 5 µm.

3. The epitaxial wafer in accordance with claim 1, wherein said covering layer has a thickness of at least 10 nm and less than 1 µm.

4. The epitaxial wafer in accordance with claim 1, wherein said covering layer covers all surfaces of said substrate.

5. The epitaxial wafer in accordance with claim 4, wherein said covering layer has a thickness of at least 5 nm and less than 5 µm.

6. The epitaxial wafer in accordance with claim 4, wherein said covering layer has a thickness of at least 10 nm and less than 1 µm.

7. The epitaxial wafer in accordance with claim 1, wherein said compound semiconductor substrate includes a material selected from the group consisting of GaAs, InP, GaP, InAs, AlGaAs and GaAsP.

8. A method of preparing the epitaxial wafer in accordance with claim 1, comprising the steps of:
   growing said covering layer at a growth temperature of at least 300° C. and less than 800° C. so as to cover at least said front and back surfaces of said compound semiconductor substrate; and
   annealing said substrate having said covering layer thereon at an annealing temperature of at least 700° C. and less than 1200° C.

9. The method of preparing the epitaxial wafer in accordance with claim 8, wherein said growth temperature for growing said covering layer is at least 400° C. and less than 600° C.

10. The method of preparing the epitaxial wafer in accordance with claim 8, wherein said compound semiconductor substrate includes a material selected from the group consisting of GaAs, InP, GaP, InAs, AlGaAs and GaAsP.

11. The method of preparing the epitaxial wafer in accordance with claim 8, wherein said annealing is carried out for a time in a range from about 10 minutes to about 5 minutes in connection with said annealing temperature being in a range from 850° C. to 1100° C.

12. The method of preparing the epitaxial wafer in accordance with claim 8, wherein said steps of growing and annealing are carried out immediately successively in a single process chamber by varying a temperature in said chamber from said growth temperature to said annealing temperature.

13. The epitaxial wafer in accordance with claim 1, wherein said covering layer has such a crystalline structure as results from annealing said covering layer at an annealing temperature of at least 700° C. and less than 1200° C. for a time in a range from 5 to 10 minutes.

14. The epitaxial wafer in accordance with claim 1, wherein said covering layer has a single-crystalline crystal structure.

15. The epitaxial wafer in accordance with claim 1, exhibiting stress relaxation of said covering layer relative to said substrate along a lattice mismatched interface between said covering layer and said substrate along said front and back surfaces.

16. The epitaxial wafer in accordance with claim 1, wherein said covering layer has a thickness in a range from 30 nm to 40 nm.

17. The epitaxial wafer in accordance with claim 1, wherein said covering layer is a solid continuous film without breaks, without separation from said substrate, without pinholes, and without pyramidal growth at nucleation sites.

18. The epitaxial wafer in accordance with claim 1, wherein said covering layer is an epitaxially grown layer that is epitaxially grown by a vapor phase epitaxial growth process on said front and back surfaces of said substrate, and wherein a composition of said covering layer does not match a composition of said substrate.

19. The epitaxial wafer in accordance with claim 1, wherein said covering layer consists of said material selected from said group consisting of GaN, InN, AlN and nitride mixed-crystalline materials.

20. The epitaxial wafer in accordance with claim 14, wherein said crystal structure of said covering layer is mismatched relative to a crystal structure of said substrate.

* * * * *

UNITED STATES PATENT AND TRADEMARK OFFICE
CERTIFICATE OF CORRECTION

PATENT NO. : 6,031,252
DATED : Feb. 29, 2000
INVENTOR(S) : MIURA et al.

It is certified that error appears in the above-identified patent and that said Letters Patent is hereby corrected as shown below:

On the Title Page, under [57] "ABSTRACT",
        line 11, after "covering", replace "thereon layer" by --layer thereon--;

Col. 1, line 40, after "which", insert --requires--.
Col. 2, line 62, after ",", replace "GS-IBE" by --GS-MBE--;
Col. 4, line 32, after "of", replace "quality" by --quartz--;
Col. 5, line 23, after "sample", insert --that had been--;
      line 32, after "1." insert --Namely,--;
      line 55, after "the", replace "(1111" by --(111)--;
      line 63, after "for", replace "carring" by --carrying--;
      line 65, after "was", replace "carring" by --carried Column 5, line 26, delete "that had been".

Signed and Sealed this

Twentieth Day of February, 2001

Attest:

NICHOLAS P. GODICI

Attesting Officer     Acting Director of the United States Patent and Trademark Office